United States Patent [15] 3,660,781
Tewksbury et al. [45] May 2, 1972

[54] LOW POWER FREQUENCY SYNTHESIZER WITH TWO PHASE LOCKING LOOPS

[72] Inventors: John M. Tewksbury, Lutherville; Harold W. Jackson, Baltimore; Thomas H. Powell, Jr., Lutherville, all of Md.

[73] Assignee: The Bendix Corporation

[22] Filed: Oct. 19, 1970

[21] Appl. No.: 81,991

[52] U.S. Cl. ....................331/1 A, 331/11, 331/14, 331/27

[51] Int. Cl. ....................H03b 3/04

[58] Field of Search ....................331/1 A, 10, 11, 14, 18, 25, 331/27; 307/232, 235

[56] References Cited

UNITED STATES PATENTS 3,546,618 12/1970 Menkes ....................331/10
3,528,026 9/1970 Groendycke ....................331/11

*Primary Examiner*—John Kominski
*Assistant Examiner*—Siegfried H. Grimm
*Attorney*—Plante, Hartz, Smith & Thompson, Bruce L. Lamb and William G. Christoforo

[57] ABSTRACT

A stabilized, low power frequency synthesizer operates in two time determined modes. In a temporary first mode used to initially place the synthesizer at a selected frequency, the synthesizer makes use of a standard digital phase locked loop wherein a voltage controlled oscillator output frequency is counted down by a divider, with the divided frequency being compared to a standard frequency in a phase detector to generate an error signal to control the voltage controlled oscillator. In a second mode used to hold the synthesizer at the selected frequency an analog circuit samples the voltage controlled oscillator output frequency at regular sampling intervals which are determined by the period of the standard frequency. These samples comprise a second error signal. The circuit characteristics of the various error signal generating circuits permit the second error signal to be permanently connected to the voltage controlled oscillator while a switching circuit permits connection of the first error signal to the voltage controlled oscillator in accordance with a predetermined timed program when the selected frequency is changed or during initial start up.

17 Claims, 5 Drawing Figures

INVENTORS
JOHN M. TEWKSBURY
HAROLD W. JACKSON
THOMAS H. POWELL, JR.
BY William G. Christoforo
ATTORNEY INVENTORS
JOHN M. TEWKSBURY
HAROLD W. JACKSON
THOMAS H. POWELL, JR.
BY
William G. Christoforo
ATTORNEY INVENTORS
JOHN M. TEWKSBURY
HAROLD W. JACKSON
THOMAS H. POWELL, JR.
BY
William G. Christoforo
ATTORNEY

LOW POWER FREQUENCY SYNTHESIZER WITH TWO PHASE LOCKING LOOPS

BACKGROUND OF THE INVENTION

This invention relates to stabilized variable frequency oscillators of the type normally termed frequency synthesizers and currently used in radio frequency communication and like equipment. In particular, the invention concerns a frequency synthesizer requiring only a minimum amount of power to operate, thus permitting advantageous application of the synthesizer in portable or otherwise easily transportable equipment or in other applications where low power drain considerations are important.

Frequency synthesizers using a digital phase locked loop to select and stabilize a desired output frequency are well known. Briefly, this type of synthesizer includes a voltage controlled oscillator whose generated frequency is the desired output frequency, this output frequency being fed back through a divider, comprised of a variable digital counter, which divides the fed back frequency by whole number N. If the number N is properly chosen with respect to the desired frequency, the divided frequency will be equal to the frequency generated by a reference frequency source. The reference frequency and divided frequency are compared in a phase detector. Any detected phase difference is used to adjust the voltage controlled oscillator frequency.

The digital counter used to divide the fed back frequency signal in this type frequency synthesizer consumes a large portion of the power required to operate the synthesizer. Since a major application of these synthesizers is in portable and like equipment it can be seen that improvements which will permit the frequency divider to be turned off during all but the initial start up of the synthesizer will be advantageous especially with respect to the power supply requirements of the system.

SUMMARY OF THE INVENTION

In this invention there is provided in a frequency synthesizer, in addition to a digital phase locked loop which initially sets the synthesizer to a selected frequency, an analog sample circuit which samples the output frequency signal once every 1/N cycles of the output frequency signal where N is a whole number related to the reference frequency used in the operation of the digital phase locked loop. Samples which remain constant one to the other indicate that the synthesizer is at the correct frequency. Samples which do not remain constant one to the other indicate that the synthesizer is not at the selected frequency and cause the generation of an error signal to restore the correct synthesizer frequency.

The source impedance of the sample circuit at its connection to the frequency determining circuit of the voltage controlled oscillator is designed to be high while the source impedance of the digital phase locked loop at its connection to the frequency determining circuit is designed to be low. Because of this, if both the phase locked loop and the sample circuits are connected in common to the frequency determining circuits of the voltage controlled oscillator, the signal from the phase locked loop will overwhelm and render ineffective the signal from the sample circuit. Thus, during initial set-up of the synthesizer it is merely necessary to switch the phase locked loop onto a common terminal with the sample circuit. When the selected frequency, as determined by the phase locked loop, is generated by the synthesizer it is merely necessary at that time to remove the phase locked loop from the common terminal and the sample circuit will then acquire control of the synthesizer.

Accordingly, it is an object of this invention to provide a low power stabilized frequency synthesizer.

It is another object of this invention to provide a stabilized frequency circuit having a digital phase locked loop to initially acquire a selected frequency and an analog circuit to maintain the selected frequency once acquired.

It is another object of this invention to provide a stabilized frequency synthesizer having parallel digital and analog error signal generating circuits.

It is still another object of this invention to provide a stabilized frequency synthesizer having a permanently connected analog feedback circuit and a digital feedback circuit switchably shunting said analog feedback circuit.

It is one more object of this invention to provide a stabilized frequency synthesizer having a novel digital phase detector.

One further object of this invention is to provide a novel sample circuit for a low power stabilized frequency synthesizer.

These and other objects of the invention become apparent from a reading of the following detailed description of the invention.

DESCRIPTION OF THE PREFERRED EMBODIMENT

Figure 1:
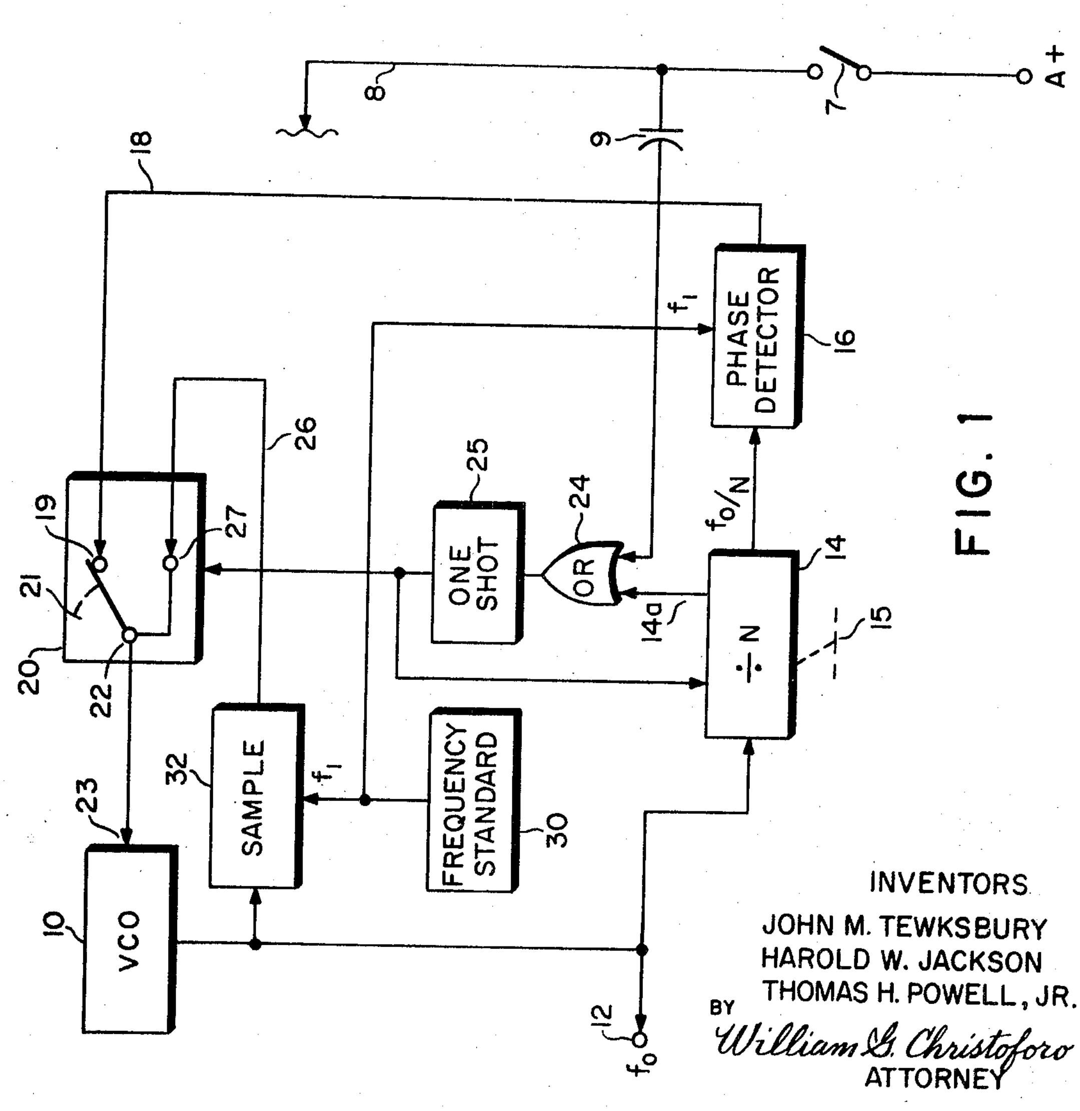
FIG. 1 is a block diagram of the invention.

Referring first to FIG. 1 there is seen a voltage controlled oscillator 10 which may be of any suitable conventional type producing a sine wave or other waveform whose frequency can be tuned over a prescribed range in response to a tuning voltage applied to the frequency control input 23 of the voltage controlled oscillator. The output frequency of voltage controlled oscillator 10 is designated as $f_0$ and is applied to the synthesizer output terminal 12 where it is available for use. The oscillator output, $f_0$, is also applied to the input of a conventional binary counter 14 which divides the frequency applied thereto by N, where N is an integer within the capability of the synthesizer and which is variable by the manipulation of the control, represented at 15, in a manner well known to those skilled in this art. The output of divider 14, which is a frequency having a repetition rate equal to $f_0$ divided by N, is applied as one input to the phase detector 16. A frequency standard 30 in this embodiment is shown as a locally situated master oscillator generating a frequency $f_1$. An equivalent embodiment could comprise any suitable source of periodic signals such as a remotely located transmitter from which the signal $f_1$ is received over a radio or other link. As is the case with voltage controlled oscillator 10 the reference frequency $f_1$ might have a sinusoidal, rectangular or other shape waveform. The means for processing these various waveforms are well known to those skilled in the art and need not be discussed at this time. The reference frequency $f_1$ is applied as input to phase detector 16 wherein it is compared with the second input signal $f_0$/N. Any phase difference existing between the two input signals to phase detector 16 results in an error signal being generated along line 18 to be applied to terminal 19 and via switch arm 21 of electronic switch 20 to the input terminal 23 of the frequency determining circuits of the voltage controlled oscillator 10. If the signal inputs to phase detector 16 are in phase the phase detector generated error signal will allow voltage controlled oscillator 10 to continue to generate its present output frequency. In this case, of course, the repetition rate of signal $f_1$ will be equal to the repetition rate of signal $f_0$/N, in addition to the two signals being exactly in phase.

Although arm 21 of electronic switch 20 is shown connecting terminal 19 to terminal 22 whereby the output of phase detector 16 is applied to the frequency determining port 23 of voltage controlled oscillator 10, it should be understood that this position of arm 21 is in response to an output from one shot 25, the normal position of arm 21 in the absence of the one-shot 25 output pulse being to disconnect terminal 22 from terminal 19. One-shot 25 is triggered to generate its output pulse whenever the factor N introduced by variable divider 14 by manipulation of control 15 is changed. This results in a signal, generated by divider 14, being applied via line 14a through OR gate 24 to trigger the one-shot. The signal from the divider, although not shown, might simply be derived from transients inherently generated when the circuits of divider 14 are disturbed during the changing of the N factor. One-shot 25 might also be triggered to generate its output pulse by means which initially turns the synthesizer on. This is represented by switch 7 which supplies power from an A+ voltage source to line 8 which suitably in turn delivers power to the synthesizer circuits. Current in-rush at the closing of switch 7 is detected by capacitor 9 to trigger one-shot 25 through OR gate 24. The period of the one-shot 25 output pulse in this embodiment is a fixed period slightly longer than the time required for the phase locked loop comprised of divider 14 and phase detector 16 to acquire a frequency after initial turn-on of the synthesizer or after a change of the factor N.

At the expiration of the one-shot 25 output pulse electronic switch 20 returns to its normal position, that is with arm 21 disconnected from terminal 19.

A second frequency determining loop paralleling the aforementioned phase locked loop is comprised of a sample circuit 32. This latter circuit receives as one input the frequency output $f_0$ from the voltage controlled oscillator and receives as a second input the reference frequency $f_1$ from the frequency standard 30. The sampling portion of this circuit is basically a gating device which is qualified at an $f_1$ repetition rate to sample the output of the voltage controlled oscillator. The $f_0$ input to sample circuit 32 has suitably a sine waveform, which is the normal waveform generated by a voltage controlled oscillator.

It can be seen that since, at the time the synthesizer frequency is determined by the phase locked loop, $f_1$ is equal to $f_0$/N, that now when the sample circuit assumes control of the voltage controlled oscillator the synthesizer output frequency $f_0$ is being sampled at a rate of $f_0$/N. In other words, $f_0$ is sampled every Mth cycle, where M is an integer. It should be obvious that since M is an integer, the magnitude of $f_0$ as sampled will be constant from one sample to another so long as the synthesizer remains synchronized. In this embodiment M=N. However, it should be obvious that any integer M will keep the synthesizer synchronized.

Any difference of one sample with respect to a subsequent sample is a measure of synthesizer drift and can be used to maintain synchronization. For simplicity the sampling times will be taken at zero crossings of $f_0$ as will be shown below. But it should now also be obvious that samplings if taken every Mth cycle can generally be taken anywhere on the $f_0$ waveform with the exception that the loop will be stable only when the sampling occurs on that portion having a slope to make the feedback negative.

Figure 3:
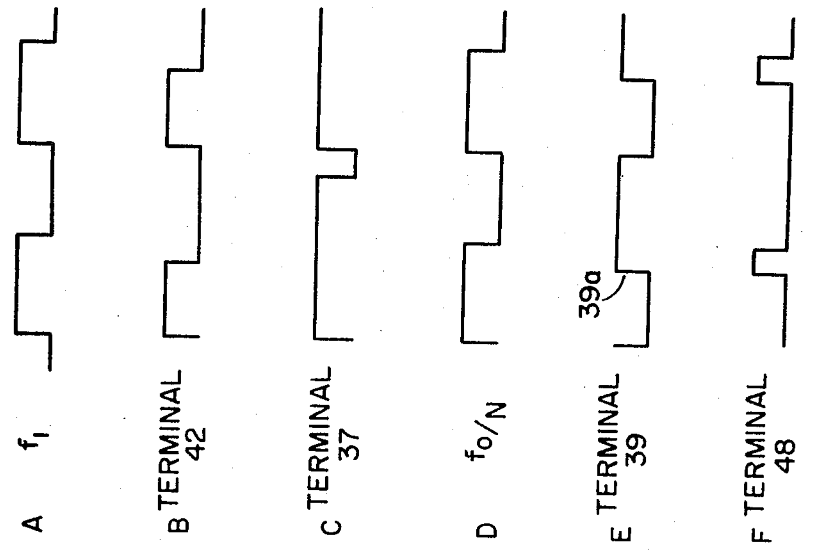
FIG. 3 consists of a number of waveforms taken at various points in the digital phase detector circuit of FIG. 2 and useful for explaining the operation of that circuit.
Figures 2, 5:
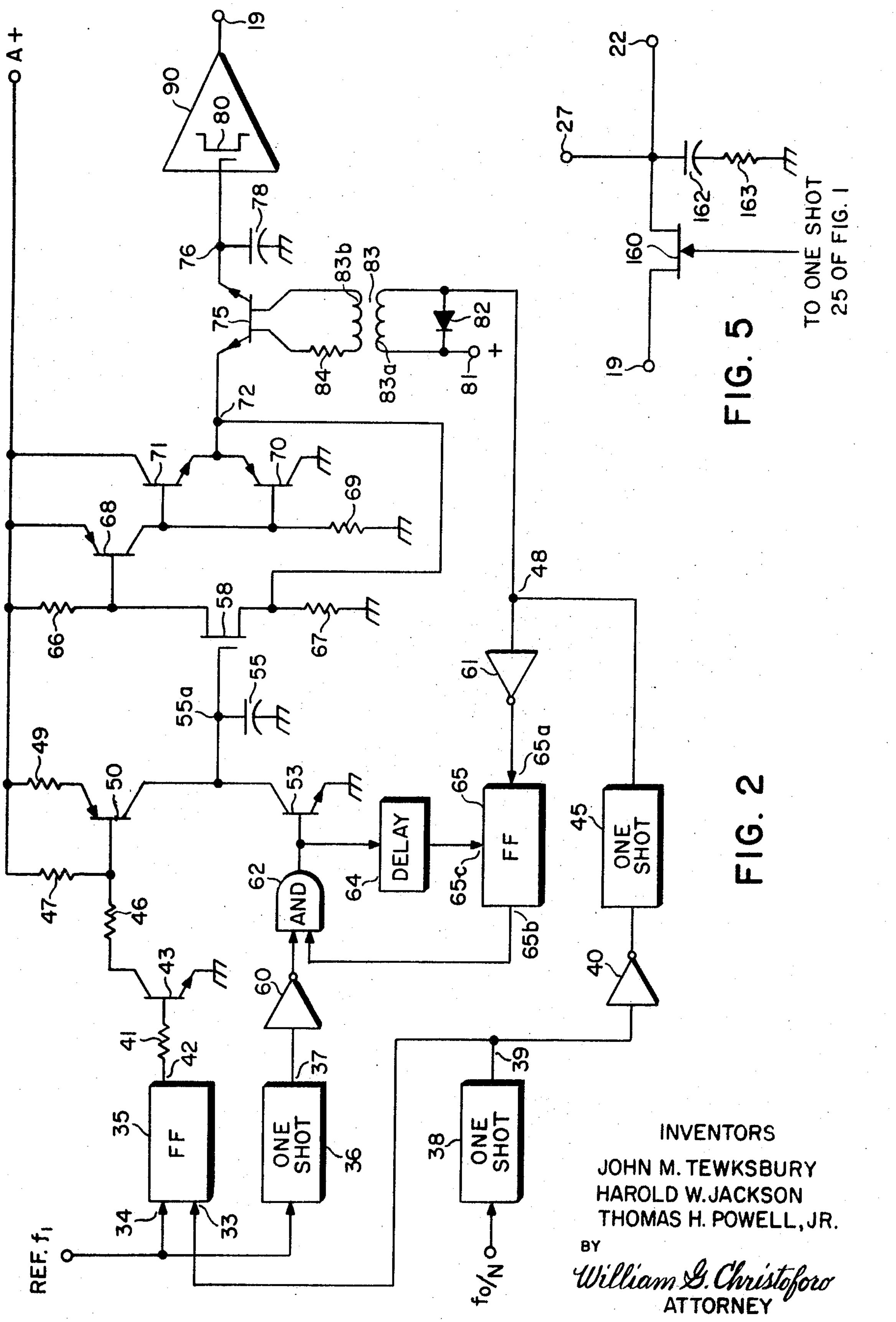
FIG. 2 is a modified schematic of a digital phase detector suitable for use in the digital phase locked loop of the invention.
FIG. 5 is a schematic of a switching and rate circuit for connecting the digital phase locked loop to the frequency determining circuits of the voltage controlled oscillator.

Refer now to the modified schematic of the phase detector 16 as seen in FIG. 2 and to the waveforms of FIG. 3. The reference frequency $f_1$ from the frequency standard 30 of FIG. 1 is applied to one input 34 of a flip-flop 35. The divided down synthesizer output frequency, $f_0$/N, as obtained from divider 14 of FIG. 1 is applied to the one-shot 38. As can be seen in FIG. 3 the various waveforms present in the schematic of FIG. 2 are considered to be square waveforms. As this description proceeds it should become obvious that the shape of these waveforms is immaterial and that it is only important that various positive-going and negative-going transitions of the waveform be sharply formed. Pulse shaping circuits suitable for forming the sharp transitions are well known by those skilled in the art and may be suitably chosen by the circuit designer to satisfy the requirements of the actual waveforms present. Returning now to a description of the figures, positive-going transitions of the reference frequency $f_1$, seen at FIG. 3 line A, trigger flip-flop 35 at input port 34 to generate a relatively high voltage signal at flip-flop output port 42 as seen in FIG. 3 line B. This relatively high voltage signal is coupled through resistor 41 to the base electrode of NPN transistor 43, which has its emitter electrode connected to ground. Transistor 43 is thus switched on to apply ground potential at its collector electrode. A constant current generator comprised of PNP transistor 50 together with resistors 47 and 49 and having an emitter electrode connected through resistor 49 to an A+ voltage terminal and its base electrode connected through resistor 47 to the A+ voltage terminal and which, while transistor 43 is non-conductive is also non-conductive, is now switched on by the ground signal applied from the collector of transistor 43 through resistor 46 to the base electrode of transistor 50. It is assumed that during this time an NPN transistor 53 having its collector electrode connected in common with the collector electrode of transistor 50 and an emitter electrode connected to ground, is non-conductive. Thus current will flow from the constant current generator comprised of transistor 50 on to one plate 55a of charge storage capacitor 55 whose other plate is connected to ground. Plate 55a is also connected to the gate electrode of field effect transistor 58. Since the gate of this type of field effect transistor presents an extremely high input impedance, the charge received from transistor 50 and stored across capacitor 55 will remain essentially constant so long as transistor 53 remains non-conductive. A ramping voltage will thus build up across capacitor 55 while transistor 50 is conductive.

The positive-going excursions of reference frequency $f_1$ are also applied to trigger one-shot 36 as seen in FIG. 3 line C. The triggered output pulse of this one-shot occuring at terminal 37 consists of a positive-going pulse which is applied to an inverter 60. The period of the one-shot 36 output pulse is made slightly less than the period of reference frequency $f_1$, which is precisely known as it is generated by the frequency standard. Its positive-going output pulse from one-shot 36 when inverted by inverter 60 now becomes a relatively low voltage signal which is applied through AND gate 62 to the base electrode of transistor 53. Thus transistor 53 becomes non-conductive at the same time constant current generator 50 becomes conductive and remains non-conductive during the period of the one-shot 36 output pulse.

As previously mentioned the divided down synthesizer frequency $f_0$/N is applied to trigger one-shot 38. As seen in FIG. 3 this divided down synthesizer frequency is assumed at this time to be in phase with the reference frequency. Also as can be seen in FIG. 3 line E the quiescent output of one-shot 38 is a relatively high voltage signal, while its triggered output pulse is a relatively low voltage signal. This output pulse appears at terminal 39 and is transferred to a second input 33 of flip-flop 35. When the signal at terminal 33 is high the signal at output terminal 42 is low. In other words, during the quiescent time of one-shot 38, the signal at output terminal 42 is low so that the constant current generator 50 is turned off. Thus, to summarize, just prior to the leading edge of waveform $f_1$ transistor 53 is conductive and transistor 50 is non-conductive so that both plates of capacitor 55 are at the common ground potential. At the leading edge of reference frequency $f_1$ transistor 53 is made non-conductive by the action of one-shot 36 while transistor 50 is made conductive by the action of flip-flop 35. At some fixed time delay after the leading edge of the divided down synthesizer frequency, which time delay is introduced by one-shot 38, transistor 50 is made non-conductive by the action of the signal at input terminal 33 of flip-flop 35. The voltage now trapped across capacitor 55 will be, if the reference frequency is in phase with the divided down synthesizer frequency, a measure of the duration of the output pulse of one-shot 38. If, however, these two frequencies are not synchronized, the voltage trapped across capacitor 55 will be more or less than this nominal voltage, depending upon whether the leading edge of the divided down synthesizer frequency occurs after or before, respectively, than the leading edge of the reference frequency.

An amplifier having a unity gain connects plate 55a to terminal 72. This amplifier is comprised of the aforementioned field effect transistor 58 having its gate electrode connected to capacitor plate **55*a* and a source-drain circuit serially connected with resistors 66 and 67 across the A+ voltage supply. The amplifier also includes a PNP transistor 68 having its emitter electrode connected to the A+ voltage terminal and its collector electrode connected to the base electrodes of transistors 71 and 70 and additionally connected through resistor 69 to ground, and having a base electrode directly connected to the drain of transistor 58. Transistors 70 and 71 are oppositely poled transistors having commonly connected emitters connected to terminal 72, transistor 70 collector electrode being connected to ground and transistor 71 collector electrode being connected to the A+ voltage terminal. Stabilizing feedback is provided by directly connecting output terminal 72 to the source electrode of transistor 58. Since terminal 72 is connected to the emitter electrodes of transistors 70 and 71, a low impedance is presented at that point. As already discussed the input impedance of the gate electrode of transistor 58 is extremely high, thus the amplifier being of unity gain essentially performs impedance transformation from the high impedance at its input to a low impedance at its output. This is essential to allow the voltage trapped across capacitor 55 to be rapidly transferred to capacitor 78, as explained below, without affecting the voltage across capacitor 55**.

The voltage at terminal 72 is transferred to capacitor 78 by the split electrode switch 75 suitably a chopper transistor, for example, a type 3N87 chopper transistor, which has one emitter electrode connected to terminal 72 and its other emitter electrode connected to one plate 76 of storage capacitor 78. The second plate of capacitor 78 is connected to ground. Also note that plate 76 is connected to the gate electrode of field effect transistor 80, this gate having the high input impedance characteristic for this type of transistor. Thus, when split electrode switch 75 is conductive the voltage stored across capacitor 55 is transferred rapidly in its entirety across capacitor 78.

Split electrode transistor 75 is made conductive as follows. The trailing edge of one-shot 38 output pulse, which as can be seen in FIG. 3 line E is the positive-going edge **39*a*, in addition to turning off transistor 50 as previously described, also is applied through inverter 40 to trigger one-shot 45. One-shot 45 in response thereto generates a positive-going pulse which appears at terminal 48 and can be seen in FIG. 3 line F. This positive-going output pulse is shunted through diode 82 to a terminal 81 which has maintained thereon a voltage level which is negative with respect to the triggered output level of one-shot 45 but which is positive with respect to its quiescent output level. Thus at the expiration of the one-shot 45 output pulse when the signal at terminal 48 returns to its relatively low voltage position, diode 82 becomes back-biased and an initial surge of current flows from terminal 81 to terminal 48 through the primary winding 83*a* of transformer 83. This induces an enabling signal in the secondary winding 83*b* which can be seen to be connected serially with resistor 84 across the trigger taps of split electrode switch 75, thereby momentarily closing this switch to transfer the voltage across capacitor 55 to capacitor 78**.

The field effect transistor 80 comprises the first stage in a second unity gain amplifier 90 which provides an impedance transformation between the high input impedance gate of transistor 80 and a low input impedance terminal 19 which also is seen in FIG. 1 as one terminal of the electronic switch 20.

Return now to FIGS. 2 and 3 and consider the case where the reference frequency $f_1$ is much higher than the divided down synthesizer frequency. In this case it is desirable that capacitor 55 be charged to some high value and not be discharged by the action of one-shot 36 until its voltage has been sampled and transferred to capacitor 78. Additionally, in the case where the reference frequency is very low with respect to the divided down synthesizer frequency it is entirely proper and will not effect the operation of the circuit if capacitor 55 is sampled a number of times before transistor 53 becomes conductive to discharge the capacitor. Thus, it can be seen that both the reference frequency and the divided down synthesizer frequency should be considered before transistor 53 is made conductive. This is provided by flip-flop 65, AND gate 62 and the short delay 64 as follows. Terminal 48 is connected through inverter 61 to input **65*a* of flip-flop 65. The output of delay 64 is applied to the second input 65*c* of this flip-flop. The output from the flip-flop appearing at output terminal 65b is applied to AND gate 62 together with the output from inverter 60 with the output from AND gate 62 being applied to delay 64 and additionally to the base electrode of transistor 53. A relatively high voltage signal at terminal 65*a* causes the output at terminal 65*b* to go high while a relatively high voltage signal at terminal 65*c* will extinguish the high signal at terminal 65*b*. Thus, during the one-shot 45 quiescent period the beginning of which occurs immediately upon capacitor 55 being sampled, this low voltage signal is inverted by inverter 61 to apply a high voltage signal at input terminal 65*a* causing the output at 65*b* to go high so as to qualify AND gate 62. Thus AND gate 62 becomes qualified directly after capacitor 55 is sampled and the signal from inverter 60 will be effective to make transistor 53 conductive only after the sample has been obtained. At the same time capacitor 55 is discharged by the action of transistor 53 the AND gate 62 output is applied to delay 64 which extinguishes the signal at terminal 65*b* after a short delay sufficient to allow capacitor 55** to discharge completely.

Considering that $f_0$/N is to be made equal to $f_1$ it should be obvious at this time that $f_0$/N and $f_1$ as supplied to the digital phase detector can be interchanged if the obvious reversal of the error signal is taken into account.

Figure 4:
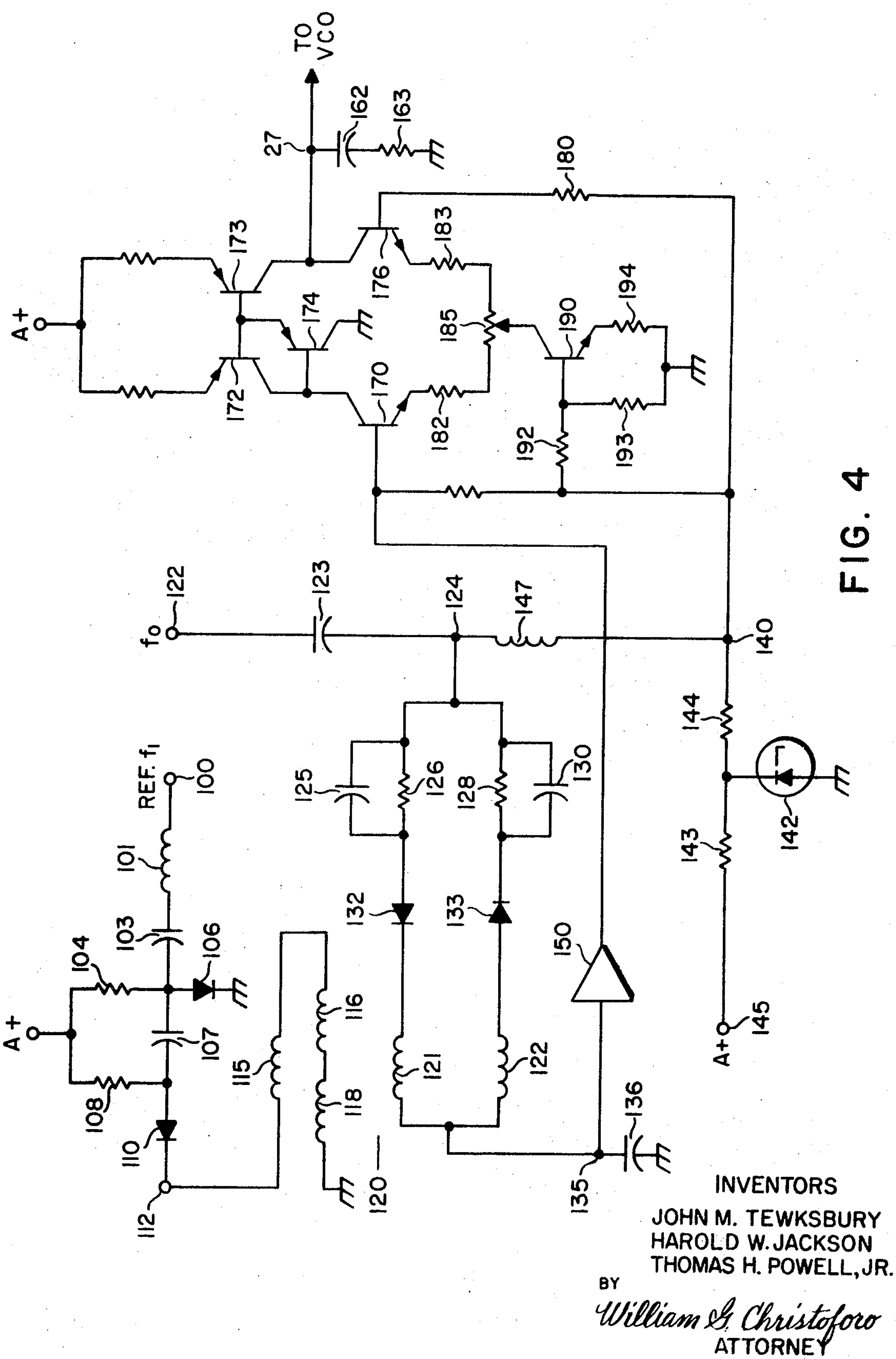
FIG. 4 is the schematic of a sample circuit suitable for use in the invention.

Refer now to FIG. 4 which is a schematic of the sample circuit earlier seen in FIG. 1. The reference frequency $f_1$ generated by the frequency standard of FIG. 1 is applied to terminal 100. An inductor 101, capacitors 103 and 107 and a snap diode 110 been serially connected between terminal 100 and a terminal 112 located at the cathode of the diode. A second snap diode 106 is connected between the junction of capacitors 103 and 107 to ground while resistors 104 and 108 are connected together at one end onto the positive terminal of the power supply with the other end of resistor 104 connected to the anode of snap diode 106 and the other end of resistor 108 connected to the junction between capacitor 107 and the anode of diode 110. The aforementioned circuitry between terminal 100 and terminal 112 is a pulse shaping circuit which shapes the reference frequency signal at terminal 100 into a train of extremely short sharp peaked sampling pulses which appear at terminal 112 and which have a repetition frequency equal to the repetition frequency of the reference signal. The primary of a pulse transformer 120 consists of windings 115, 116 and 118 which are serially connected between terminal 112 and ground. Current flows from these primary windings in response to the sampling pulses.

The synthesizer output frequency $f_0$ is applied at terminal 122 and capacitively coupled through capacitor 123 to remove any d-c components onto terminal 124. It will be noted that a regulated d-c voltage is also present at terminal 124 by reason of the action of the voltage regulator consisting of Zener diode 142 connected between round and the junction of resistors 143 and 144, which resistors connect terminal 145, the positive voltage terminal, and terminal 140, this latter terminal being coupled to terminal 124 through inductor 147. Inductor 147 presents an impedance to the frequency signal at terminal 124. Terminal 124 is coupled to terminal 135 at one plate of charge storage capacitor 136 whose other plate is connected to ground, through the bilateral gate circuit which includes secondary windings 121 and 122 of transformer 120 connected in parallel and being respectively serially connected with diodes 132 and 133 and current limiting resistors 126 and 128. Speed-up capacitors 125 and 130 are provided to respectively shunt resistors 126 and 128. Normally, that is, with no primary current flowing in transformer 120, secondary windings 121 and 122 present a high impedance to terminal 135. However, in the presence of transformer primary current flow, which has been mentioned is responsive to a sampling pulse at terminal 112, the impedance at secondary windings 121 and 122 drops sharply permitting electrical communication between terminals 124 and 135 through either diode 132 or 133 depending on the polarity of the signal at terminal 124 with respect to the polarity of the signal at that time at terminal 135. It will be remembered that the sampling pulses at terminal 112 are extremely short so that the gate circuit comprised of windings 121 and 122 is open to allow electrical communication thereacross for only a very short period of time. Also remembering that the sampling pulses occur at a pulse repetition frequency equal to the frequency of reference signal $f_1$ and also remembering that the synthesizer has already been stabilized by the phase locked loop previously described so that at this time $f_1$ is equal to $f_0$/N, where N is an integer, it should be obvious that synthesizer frequency $f_0$ is being sampled at the same point on its waveform each time it is sampled so long as the synthesizer remains at the proper frequency. Under these conditions the voltage across capacitor 136 will remain constant. If the d-c bias impressed on terminal 124 is a voltage level identical to the signal generated by the phase detector 16 of FIG. 1 when the synthesizer is locked at the proper frequency, that is, when the phase detector generates no error signal, and the synthesizer frequency at terminal 124 is sampled at its zero crossings then the signal stored across capacitor 136 will also be a no error signal, thus tending to hold the frequency of the voltage controlled oscillator constant. Any subsequent change in the synthesizer output frequency will cause that frequency to be sampled at a different point in the waveform and thus produce an error signal at terminal 135.

Terminal 135 is connected to the base electrode of transistor 170 through buffer amplifier 150. Amplifier 150 is a unity gain amplifier having extremely high input impedance as might, for example, be provided by field effect transistor at its input so as not to disturb the voltage stored across capacitor 136.

A transconductance circuit, that is a circuit which generates an output current related to an input voltage, is basically comprised of differentially connected NPN transistors 170 and 176. The base electrode of transistor 176 is connected through resistor 180 to terminal 140, which it will be remembered is a regulated voltage terminal. PNP transistors 172 and 173 having commonly connected base electrodes, have emitter-collector circuits connected respectively in the collector circuits of transistor 170 and 176. The emitters of transistors 172 and 173 are respectively resistively connected to the A+ voltage terminals while their collector electrodes are respectively connected to the collector electrodes of transistors 170 and 176. A regulator PNP transistor 174 has its base electrode connected to the collector electrodes of transistors 170 and 172, its collector electrode grounded and its emitter electrode connected to the common base connection of transistors 172 and 173. Transistors 172, 173 and 174 together comprise a current inverter where the current drawn from the collector electrode of transistor 172 is maintained identical to the current drawn from the collector terminal of transistor 173.

The common collector connection of transistors 173 and 176 is connected to terminal 27, seen here and also in FIGS. 1 and 5. Terminal 27 is connected to the frequency determining circuits of the voltage controlled oscillator (not shown). As well known in the art, these frequency determining circuits are normally comprised of varactors or other voltage variable element which has an extremely high input impedance, hence no current will be drawn from terminal 27 into the voltage controlled oscillator.

A rate network consisting of capacitor 162 and resistor 163 is serially connected between terminal 27 and ground. The voltage across the rate network sets the frequency of the voltage controlled oscillator in the manner well known to practitioners in this art. As can be seen, current is supplied to terminal 27 from the collector electrode of transistor 173 or drawn from terminal 27 by the collector electrode of transistor 176.

The emitter electrodes of transistors 170 and 176 are connected through the serially arranged resistors 182 and 183 together with the winding of potentiometer 185. The slider of this potentiometer is connected to the collector electrode of NPN transistor 190 whose base electrode is connected through resistor 192 to the regulated voltage terminal 140, and whose emitter electrode is connected through resistor 194 to ground. Another resistor 193 is connected between the transistor's base electrode and ground to provide transistor bias. Transistor 190 together with the aforementioned resistors make up a constant current generator for transistors 170 and 176.

The slider on potentiometer 185 is adjusted so that with identical signals at the base electrodes of transistors 170 and 176, these transistor's collector currents are exactly equal. In other words, and considering the current inverter previously described, under these conditions no current is supplied to or drawn from terminal 27. It should now be obvious that this will occur for this embodiment when the synthesizer output signal as impressed on terminal 124 is sampled at the zero crossing thereof.

Refer now to FIG. 5 which shows a schematic of the electronic switch originally seen as item 20 of FIG. 1. Terminals 19, 22 and 27 here are identical to like designated terminals in FIGS. 1 and 4. It can be seen that terminal 19 communicates to the drain-source circuit of field effect transistor 160 while terminal 27 is directly connected to terminal 22. Also serially connected between terminal 22 and the ground are capacitor 162 and a resistor 163 of the rate network originally seen in FIG. 4. As can be seen in FIG. 1 terminal 19 is connected to receive the output from the phase detector 16. It will be remembered that the phase detector presented a low source impedance at its output. Terminal 27 is connected to receive the output of the sample circuit 32 of FIG. 1. It will here be remembered that the source impedance presented at the output of the sample circuit was a relatively high impedance. It will also be remembered that terminal 22 is connected to the frequency changing circuit of voltage controlled oscillator 10. With transistor 160 conductive terminal 19 is connected to terminal 22 and being of a low source impedance overpowers the signal at terminal 27, the signal at terminal 19 now controlling the frequency determining circuits of the voltage controlled oscillator. Transistor 160 is normally biased non-conductive but is made conductive by the triggered output pulse from one-shot 25 of FIG. 1. Thus, whenever power for the synthesizer is initially turned on or whenever the scaling factor N of the digital divider 14 in FIG. 1 is changed one-shot 25 is triggered and generates an output pulse which renders transistor 160 conductive so that the phase locked loop now assumes control of the synthesizer frequency output. The one-shot 25 output pulse period need only be long enough to place the voltage controlled oscillator at the proper frequency. For a synthesizer of the type here described this time will normally be much less than one second. Since the power requirements of the digital divider are much larger than the other elements of the system and this divider need only be energized during the time the phase locked loop is controlling the system, it can be seen that the average power requirements of the synthesizer is greatly reduced by this invention.

At the completion of the one-shot 25 (FIG. 1) output pulse, the digital divider is deenergized and additionally transistor 160 is rendered non-conductive. At this time the synthesizer output frequency will be exactly equal to N$f_1$ where N is the dividing factor set by the N divider and $f_1$ is the reference frequency. However, it is now highly probable that the synthesizer output frequency will not be phase locked to the reference frequency as seen by the sample circuit. In other words, samplings will most likely not be occurring at zero crossings of $f_0$. This will cause current to be supplied to or withdrawn from the rate network by the sample circuit, in the manner previously described. This, of course, will cause the synthesizer frequency to change slightly, but in a direction of allowing sampling to take place at zero crossings. Once zero crossing sampling is established the action of the sample circuit will be to return the synthesizer frequency exactly to $Nf_1$ and to hold it at that value.

Certain elements of the synthesizer, for example, the voltage controlled oscillator, frequency synthesizer, one-shots and digital divider were not shown in great detail, it being deemed that suitable elements available for operation in a synthesizer of the type described are available to one skilled in the art. Additionally, one skilled in the art in following the teachings of this invention will be able to practice the invention using obvious modifications and variations of the embodiment described. Accordingly, the invention is to be limited only by the true scope and spirit of the appended claims.

The invention claimed is:

1. A frequency synthesizer comprising:

a voltage controlled oscillator including frequency determining circuits and an output tap upon which an output frequency signal generated by said voltage controlled oscillator is available;

a source of reference frequency signals;

switching means;

a phase locked loop means for generating a first error signal and including a low source impedance output tap upon which said error signal is available and connected through said switching means to said frequency determining circuits when said switching means is closed, said phase locked loop generating said error signal in response to said output frequency signal and said reference signals;

a sample circuit means for generating a second error signal in response to said output frequency signal and said reference frequency signals and including a relatively high source impedance output tap upon which said second error signal is available, said high source impedance output tap being directly connected to said frequency determining circuits; and, means for controlling said switching means.

2. A frequency synthesizer as recited in claim 1 wherein said sample circuit means comprises:

means responsive to said reference frequency signals for generating a train of pulses;

means responsive to said train of pulses for sampling said output frequency signal; and, means responsive to said sampled output frequency signal for generating said second error signal.

3. A frequency synthesizer as recited in claim 2 and including impedance transformation means for communicating said second error signal to said high source impedance output tap.

4. A frequency synthesizer as recited in claim 1 wherein said means for controlling said switching means includes means for deenergizing said phase locked loop means when said switching means is open.

5. A frequency synthesizer as recited in claim 1 wherein said sample circuit means comprises means for periodically examining the phase conditions of said output frequency signals and said reference frequency signals and for generating said second error signal in accordance with any discrepancy found.

6. A frequency synthesizer as recited in claim 5 wherein said periodically examining means comprises:

means responsive to said reference frequency signals for generating periodically occurring sampling pulses; and, gate means responsive to said sampling pulses for sampling said output frequency signals, said second error signal being related to the magnitude of said sampled signals.

7. A frequency synthesizer having an error signal controlled oscillator for generating a synthesizer output frequency and having frequency determining circuits including an input tap, said frequency determining circuits being responsive to an error signal communicated to said input tap for setting said synthesizer output frequency, and additionally comprising:

a digital frequency divider for dividing said synthesizer output frequency;

a source of reference frequency signals having a pulse repetition frequency;

first means for comparing said divided synthesizer output frequency with said reference frequency signals to generate a first error signal;

sample circuit means responsive to said synthesizer output frequency and said reference frequency signals for sampling said synthesizer output frequency at the pulse repetition frequency of said reference frequency signals and for comparing consecutive samples with each other to generate a second error signal; and, switching means for alternately communicating said first and second error signals to said input tap;

wherein said first comparing means comprises:

means for generating a ramping signal;

means for memorizing the maximum value of said ramping signal;

means responsive to one of said divided synthesizer output frequency and said reference frequency signal for energizing said ramping signal generating means; and, means responsive to the other of said divided synthesizer output frequency and said reference frequency signal for deenergizing said ramping signal generating means and sampling said memorized maximum value, said sample comprising said first error signal.

8. A frequency synthesizer having an error signal controlled oscillator for generating a synthesizer output frequency and having frequency determining circuits including an input tap, said frequency determining circuits being responsive to an error signal communicated to said input tap for setting said synthesizer output frequency, and additionally comprising:

a digital frequency divider for dividing said synthesizer output frequency;

a source of reference frequency signals having a pulse repetition frequency;

first means for comparing said divided synthesizer output frequency with said reference frequency signals to generate a first error signal;

sample circuit means responsive to said synthesizer output frequency and said reference frequency signals for sampling said synthesizer output frequency at the pulse repetition frequency of said reference frequency signals and for comparing consecutive samples with each other to generate a second error signal; and, switching means for alternately communicating said first and second error signals to said input tap;

wherein said first comparing means comprises:

a first charge storage capacitor;

current generator means for delivering charges to said charge storage capacitor when energized;

means for discharging said charge storage capacitor when energized;

means responsive to one of said divided synthesizer output frequency and said reference frequency signal for energizing said current generator means; and, means responsive to the other of said divided synthesizer output frequency and said reference frequency signal for energizing said discharging means, the charges delivered to said capacitor being related to said first error signal.

9. A frequency synthesizer as recited in claim 8 with additionally:

a second charge storage capacitor;

second switching means;

impedance transformation means communicating said first capacitor with said second capacitor through said second switching means for providing a charge at said second capacitor related to the charge stored at said first capacitor when said second switching means is closed and without disturbing the charge at said first capacitor, the charges stored at said second capacitor being related to said first error signal.

10. A frequency synthesizer as recited in claim 12 wherein said second switching means is closed in response to said other of said divided synthesizer output frequency and said reference frequency signal.

11. Means for synchronizing first periodic signals of a first frequency with second periodic signals of a second frequency wherein said first frequency is higher than a whole integer multiple of said second frequency comprising:

a variable digital divider for dividing said first frequency by said whole integer to produce a third periodic signal of a third frequency;

means for producing a first error signal indicative of a discrepancy between the phase conditions of said second and third signals;

means for periodically examining the phase conditions of said first and second signals and for generating a second error signal in accordance with any discrepancy found;

means for generating said first periodic signals, including means responsive to an applied error signal for varying said first frequency; and, switching means responsive to variation of said digital divider for applying said first and second error signals to said first frequency varying means.

12. Synchronizing means as recited in claim 11 wherein said switching means effectively applies said first error signal to said first frequency varying means in response to variation of said digital divider and includes means for effectively applying said second error signal to said first frequency varying means a fixed time period thereafter.

13. Synchronizing means as recited in claim 11 wherein said examining and generating means comprises:

means responsive to said second periodic signals for generating a train of pulses;

means responsive to said train of pulses for sampling said first periodic signals; and, means responsive to said sampled signals for generating said second error signal.

14. Means for synchronizing first periodic signals of a first frequency with second periodic signals of a second frequency, said first frequency being a whole integer multiple of said second frequency comprising:

means for dividing said first frequency by a whole integer to produce a third periodic signal of a third frequency;

means responsive to said second and third periodic signals for generating a first error signal;

means responsive to one of said first and second periodic signals for generating a train of pulses having a first pulse repetition frequency;

means responsive to said train of pulses for periodically examining the other of said first and second periodic signals and for generating a second error signal related to the magnitude of said examined signals; and, means responsive to said first and second error signals for generating said first periodic signals; wherein said periodically examining means comprises:

a first terminal upon which said other period signals are received;

a second terminal;

means for capacitively coupling said first and second terminals;

a source of constant voltage;

means for d.c. coupling said constant voltage source to said second terminal, memory means for storing a signal impressed thereon; and, gating means opened by said train of pulses for communicating said second terminal with said memory means, the signal stored in said memory comprising said second error signal.

15. Means as recited in claim 14 wherein said means for generating said first period signals includes frequency determining means responsive to said first and second error signals and with additionally impedance transformation means for connecting said memory means with said frequency determining means.

16. A frequency synthesizer comprising:

a source of a reference frequency;

a voltage controlled oscillator including frequency determining circuits for generating a first signal of a first frequency which is an integer multiple of said reference frequency a phase locked loop means for generating a first voltage signal in response to said first signal and said reference frequency;

means responsive to said reference frequency signals for sampling said first signal at the repetition frequency of said reference frequency;

charge storage means;

bilateral current generator means responsive to said sampled first signal for supplying charges to said charge storage means;

switching means for selectively applying said first voltage signal to said charge storage means; and, means connecting said charge storage means to said frequency determining circuits.

17. A frequency synthesizer as recited in claim 16 wherein said frequency determining circuits present an essentially open circuit impedance to said charge storage means.

* * * * *